United States Patent
Hasegawa et al.

(10) Patent No.: US 7,335,460 B2
(45) Date of Patent: Feb. 26, 2008

(54) PHOTOSENSITIVE THERMOSETTING RESIN COMPOSITION, AND PHOTOSENSITIVE COVER LAY AND FLEXIBLE PRINTED WIRING BOARD USING THE COMPOSITION

(75) Inventors: Shinichi Hasegawa, Joetsu (JP); Toru Ueki, Joetsu (JP)

(73) Assignee: Arisawa Mfg. Co., Ltd., Joetsu-shi, Niigata (JP)

( * ) Notice: Subject to any disclaimer, the term of this patent is extended or adjusted under 35 U.S.C. 154(b) by 0 days.

(21) Appl. No.: 11/482,672

(22) Filed: Jul. 6, 2006

(65) Prior Publication Data
US 2007/0009834 A1    Jan. 11, 2007

(30) Foreign Application Priority Data
Jul. 6, 2005    (JP) .............................. 2005-198167

(51) Int. Cl.
G03F 7/028 (2006.01)
G03F 7/038 (2006.01)
G03F 7/09 (2006.01)
G03F 7/40 (2006.01)

(52) U.S. Cl. .............................. 430/280.1; 430/287.1; 430/284.1; 430/285.1

(58) Field of Classification Search ................. None
See application file for complete search history.

(56) References Cited

U.S. PATENT DOCUMENTS

| | | | | |
|---|---|---|---|---|
| 4,948,700 A | * | 8/1990 | Maeda et al. | 430/280.1 |
| 5,304,628 A | * | 4/1994 | Kinoshita et al. | 528/370 |
| 5,702,820 A | * | 12/1997 | Yokoshima et al. | 428/413 |
| 5,854,325 A | * | 12/1998 | Hosomi et al. | 524/425 |
| 6,136,506 A | * | 10/2000 | Hashimoto et al. | 430/280.1 |
| 2004/0067440 A1 | * | 4/2004 | Minegishi et al. | 430/280.1 |

FOREIGN PATENT DOCUMENTS

| | | |
|---|---|---|
| JP | 10-020493 A | 1/1998 |
| JP | 2003-195486 A | 7/2003 |
| JP | 2003-241369 A | 8/2003 |
| JP | 2005-062449 A | 3/2005 |
| JP | 2005-062450 A | 3/2005 |
| KR | 2003-0051419 A | 6/2003 |
| KR | 10-2004-0092267 A | 11/2004 |
| WO | WO 9800759 A1 * | 1/1998 |

* cited by examiner

*Primary Examiner*—Cynthia Hamilton
(74) *Attorney, Agent, or Firm*—Drinker Biddle & Reath LLP

(57) ABSTRACT

An object of the present invention is to provide a photosensitive thermosetting resin composition that has a long shelf life and has excellent normal temperature storage stability, has good solder heat resistance after curing, and according to which high adhesive strength can be maintained. The present invention provides a photosensitive thermosetting resin composition containing a photosensitive prepolymer, a photosensitive monomer, a thermosetting resin, a curing agent, and a polymerization initiator, the photosensitive thermosetting resin composition containing (A) a carboxylic acid-modified bisphenol type epoxy (meth)acrylate as the photosensitive prepolymer.

20 Claims, 1 Drawing Sheet

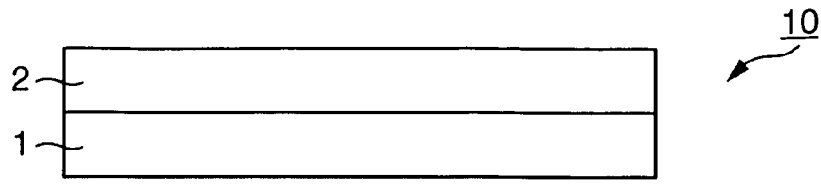
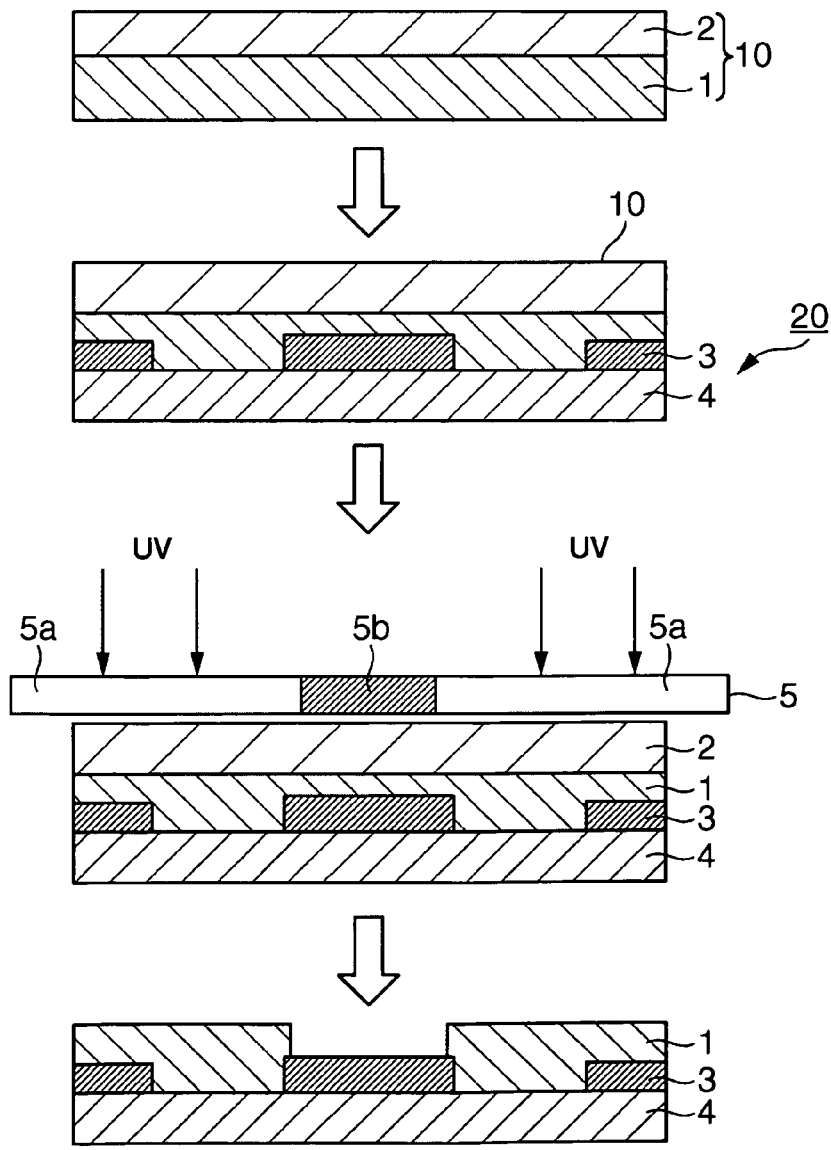

PHOTOSENSITIVE THERMOSETTING RESIN COMPOSITION, AND PHOTOSENSITIVE COVER LAY AND FLEXIBLE PRINTED WIRING BOARD USING THE COMPOSITION

CROSS-REFERENCES TO RELATED APPLICATIONS

The entire disclosure of Japanese Patent Application No. 2005-198167, filed on Jul. 6, 2005, is expressly incorporated by reference herein.

BACKGROUND

The present invention relates to a photosensitive thermosetting resin composition that has a long shelf life and has excellent normal temperature storage stability, has good solder heat resistance after curing, and according to which high adhesive strength can be maintained, and to a photosensitive cover lay and a flexible printed wiring board using the composition.

Various art relating to photosensitive cover lays (photosensitive dry films) and to photosensitive thermosetting resin compositions for forming such photosensitive cover lays and so on has been proposed hitherto.

For example, in Japanese Patent Application Laid-open No. 2005-62450, there is disclosed a resist ink photosensitive thermosetting resin composition for which the cured material has excellent folding resistance (flexibility) and so on. Specifically, this is a photosensitive thermosetting resin composition containing (A) a specified carboxyl-modified epoxy (meth)acrylate resin, (B) a biphenyl type epoxy resin, (C) a photopolymerization initiator, and (D) a diluent, wherein the carboxyl-modified epoxy (meth)acrylate resin (A) has an acid value within a specified range.

Moreover, in Japanese Patent Application Laid-open No. H10-20493, there is disclosed a solder-resist ink photosensitive thermosetting resin composition. Specifically, this is a photopolymerizable thermosetting resin composition comprising (A) an active energy ray-curable resin (a), (B) a diluent, (C) a photopolymerization initiator, (D) a cured adhesion bestowing agent, and (E) an epoxy group-containing compound, wherein the active energy ray-curable resin (a) is selected from specified unsaturated resins.

Moreover, in Japanese Patent Application Laid-open No. 2003-241369, there is disclosed a dry film resist the object of which is to improve peelability between a protective film and a photosensitive layer. Furthermore, in Japanese Patent Application Laid-open No. 2003-241369, description is given of photosensitive prepolymers, cracking improving agents, photopolymerization initiators (including sensitizers), fire retardants, fillers, and so on that can be used in the dry film resist.

Moreover, in Japanese Patent Application Laid-open No. 2003-195486, there is disclosed a photosensitive composition the object of which is to improve performance relating to the formation of a photosensitive coating film such as photosensitivity, developability, and shelf life. Specifically, this is a photosensitive composition containing (A) a compound having an ethylenic unsaturated group, (B) an epoxy resin, (C) a photopolymerization initiator, and (D) an interlayer compound in which a specified thermal polymerization catalyst is inserted into an inorganic layer compound.

For a photosensitive cover lay formed using such a conventional photosensitive thermosetting resin composition, it has been difficult to obtain a photosensitive thermosetting resin composition that has a long shelf life and has excellent normal temperature storage stability, has good solder heat resistance after curing, and according to which high adhesive strength can be maintained. Moreover, even in the case of a photosensitive thermosetting resin composition satisfying these characteristics, the flexibility after curing has sometimes been insufficient, and hence handling has been difficult.

SUMMARY

The present invention aims to solve the problems of the prior art.

That is, it is an object of the present invention to provide a photosensitive thermosetting resin composition that has a long shelf life and has excellent normal temperature storage stability, has good solder heat resistance after curing, enables high adhesive strength to be maintained, and is easy to handle.

Moreover, it is another object of the present invention to provide a photosensitive cover lay and a flexible printed wiring board using such a photosensitive thermosetting resin composition.

In the present invention, the above objects are attained by providing 1. a photosensitive thermosetting resin composition containing a photosensitive prepolymer, a photosensitive monomer, a thermosetting resin, a curing agent, and a polymerization initiator, the photosensitive thermosetting resin composition containing (A) a carboxylic acid-modified bisphenol type epoxy (meth)acrylate as the photosensitive prepolymer.

Moreover, in the present invention, the following inventions 2 to 21 are also provided.

2. The photosensitive thermosetting resin composition according to 1, wherein the carboxylic acid-modified bisphenol type epoxy (meth)acrylate, which is the component (A), has a weight average molecular weight in a range of 5000 to 20000.

3. The photosensitive thermosetting resin composition according to 1 or 2, wherein the carboxylic acid-modified bisphenol type epoxy (meth)acrylate, which is the component (A), has a carboxylic acid equivalent amount in a range from 300 to less than 1500 g/eq.

4. The photosensitive thermosetting resin composition according to any one of 1 through 3, wherein the photosensitive prepolymers further include, in addition to the component (A), (B) at least one of a carboxylic acid-modified cresol novolak type epoxy (meth)acrylate and a carboxylic acid-modified urethane (meth)acrylate.

5. The photosensitive thermosetting resin composition according to 4, wherein the carboxylic acid-modified cresol novolak type epoxy (meth)acrylate of the component (B) has a weight average molecular weight in a range of 5000 to 15000, and the carboxylic acid-modified urethane (meth)acrylate of the component (B) has a weight average molecular weight in a range of 2000 to 15000.

6. The photosensitive thermosetting resin composition according to 4 or 5, wherein the carboxylic acid-modified cresol novolak type epoxy (meth)acrylate of the component (B) has a carboxylic acid equivalent amount in a range from 300 to less than 1500 g/eq, and the carboxylic acid-modified urethane (meth)acrylate of the component (B) has a carboxylic acid equivalent amount in a range from 500 to less than 2000 g/eq.

7. The photosensitive thermosetting resin composition according to any one of 4 through 6, wherein a weight ratio of the component (A) to the component (B) constituting the photosensitive prepolymers is in a range of 80:20 to 20:80.

8. The photosensitive thermosetting resin composition according to any one of 1 through 7, wherein the thermosetting resin is an epoxy resin that has an epoxy group equivalent amount in a range from 100 to less than 600 g/eq, and contains at least two epoxy groups per molecule.

9. The photosensitive thermosetting resin composition according to any one of 1 through 8, wherein the thermosetting resin is contained in an amount such that the ratio of the epoxy group equivalent amount of the thermosetting resin to the carboxylic acid equivalent amount of the photosensitive prepolymer is in a range of 1:1 to 1:2.

10. The photosensitive thermosetting resin composition according to any one of 1 through 9, wherein the curing agent comprises at least one selected from Lewis acid-amine complexes.

11. The photosensitive thermosetting resin composition according to any one of 1 through 10, wherein the content of the curing agent is in a range from 0.1 to less than 1.0 parts by weight per 100 parts by weight of the thermosetting resin.

12. The photosensitive thermosetting resin composition according to any one of 1 through 11, wherein the polymerization initiator comprises a photopolymerization initiator not containing a nitrogen atom and a photosensitizer not containing a nitrogen atom.

13. The photosensitive thermosetting resin composition according to 12, wherein the content of the photopolymerization initiator is in a range from 5 to less than 15 parts by weight per 100 parts by weight of the photosensitive prepolymer.

14. The photosensitive thermosetting resin composition according to 12 or 13, wherein the content of the photosensitizer is in a range from 0.5 to less than 5 parts by weight per 100 parts by weight of the photosensitive prepolymer.

15. The photosensitive thermosetting resin composition according to any one of 1 through 14, wherein the photosensitive monomer has a weight average molecular weight in a range of 150 to 3000, and has at least two (meth)acryl groups therein.

16. The photosensitive thermosetting resin composition according to any one of 1 through 15, wherein the content of the photosensitive monomer is in a range from 5 to less than 50 parts by weight per 100 parts by weight of the photosensitive prepolymer.

17. The photosensitive thermosetting resin composition according to any one of 1 through 16, further containing a urethane (meth)acrylate.

18. The photosensitive thermosetting resin composition according to 17, wherein the urethane (meth)acrylate has a weight average molecular weight in a range of 2000 to 10000, and has a percentage elongation according to JIS K-7127 of not less than 80%.

19. The photosensitive thermosetting resin composition according to 17 or 18, wherein the content of the urethane (meth)acrylate is in a range of 5 to 50 parts by weight per 100 parts by weight of the photosensitive prepolymer.

20. A photosensitive cover lay comprising the photosensitive thermosetting resin composition according to any one of 1 through 19 molded into a sheet.

21. A flexible printed wiring board in which the photosensitive cover lay according to 20 is provided on metal foil forming circuitry.

According to the present invention, there are provided a photosensitive thermosetting resin composition that has a long shelf life and has excellent normal temperature storage stability, has good solder heat resistance after curing, and according to which high adhesive strength can be maintained, and a photosensitive cover lay and a flexible printed wiring board using the composition.

DESCRIPTION OF DRAWINGS

FIG. 1 is a schematic sectional view showing an embodiment of a photosensitive cover lay according to the present invention; and FIG. 2 consists of schematic sectional views showing a process for manufacturing and using an embodiment of a flexible printed wiring board according to the present invention.

DETAILED DESCRIPTION

Photosensitive Thermosetting Resin Composition

As described above, a photosensitive thermosetting resin composition of the present invention contains a photosensitive prepolymer, a photosensitive monomer, a thermosetting resin, a curing agent, and a polymerization initiator, containing (A) a carboxylic acid-modified bisphenol type epoxy (meth)acrylate as the photosensitive prepolymer. Due to the photosensitive thermosetting resin composition of the present invention having this construction, the photosensitive thermosetting resin composition has a long shelf life and has excellent normal temperature storage stability, has good solder heat resistance after curing, enables high adhesive strength to be maintained, and is easy to handle.

A carboxylic acid-modified bisphenol type epoxy (meth)acrylate (A) is used as a photosensitive prepolymer used in the present invention.

From the standpoint of good adhesion, solder heat resistance, and developability being obtained, the carboxylic acid-modified bisphenol type epoxy (meth)acrylate of component (A) preferably has a weight average molecular weight in a range of 5000 to 20000, more preferably 8000 to 13000.

From the standpoint of good adhesion, solder heat resistance, and developability being obtained, the carboxylic acid-modified bisphenol type epoxy (meth)acrylate of component (A) preferably has a carboxylic acid equivalent amount in a range from 300 to less than 1500 g/eq, more preferably from 460 to 940 g/eq.

An example of the carboxylic acid-modified bisphenol type epoxy (meth)acrylate of component (A) is a compound obtained by reacting a bisphenol type epoxy resin and (meth)acrylic acid together, and then reacting with an acid anhydride. Here, examples of the bisphenol type epoxy resin used as a starting material of the compound include ones having a bisphenol F type epoxy resin or a bisphenol A type epoxy resin as a main backbone thereof; a commercially available one may be used. Examples of the acid anhydride similarly used as a starting material include phthalic anhydride, succinic anhydride, maleic anhydride, tetrahydrophthalic anhydride, hexahydrophthalic anhydride, methylhexahydrophthalic anhydride, methyltetrahydrophthalic anhydride, itaconic anhydride, and methylendomethylenetetrahydrophthalic anhydride.

From the standpoint of improving solder heat resistance, adhesion, and also shelf life, the photosensitive prepolymers preferably further include, in addition to the component (A), (B) at least one of a carboxylic acid-modified cresol novolak type epoxy (meth)acrylate and a carboxylic acid-modified urethane (meth)acrylate.

The carboxylic acid-modified cresol novolak type epoxy (meth)acrylate of component (B) preferably has a weight average molecular weight in a range of 5000 to 15000, more preferably 8000 to 13000. The carboxylic acid-modified urethane (meth)acrylate preferably has a weight average molecular weight in a range of 2000 to 15000, more preferably 2000 to 10000. If each of these weight average molecular weights is in such a preferable range, then the shelf life can be further lengthened, and good adhesion, solder heat resistance, and developability can be obtained.

From the standpoint of further lengthening the shelf life and it being possible to obtain good adhesion, solder heat resistance, and developability, the carboxylic acid-modified cresol novolak type epoxy (meth)acrylate of component (B) preferably has a carboxylic acid equivalent amount in a range from 300 to less than 1500 g/eq, more preferably in a range from 460 to 940 g/eq.

Moreover, from the standpoint of further lengthening the shelf life and it being possible to obtain good adhesion, solder heat resistance, developability, and flexibility, the carboxylic acid-modified urethane (meth)acrylate of component (B) preferably has a carboxylic acid equivalent amount in a range from 500 to less than 2000 g/eq, more preferably in a range from 900 to 1900 g/eq.

In the case of using such a component (B) as a photosensitive prepolymer, the weight ratio of component (A) to component (B) (former: latter) is preferably in a range of 80:20 to 20:80. If component (A) is more abundant than this, then the shelf life may shorten, whereas if component (A) is less abundant than this, then the solder heat resistance and the adhesion may drop.

Examples of the photosensitive monomer used in the present invention include polytetramethyleneglycol di(meth)acrylate, ethoxylated 2-methyl-1,3-propanediol di(meth)acrylate, 1,6-hexanediol di(meth)acrylate, 2-methyl-1,8-octanediol di(meth)acrylate, 1,9-nonanediol di(meth)acrylate, 1,10-decanediol di(meth)acrylate, polyethylene glycol di(meth)acrylate, polypropylene glycol di(meth)acrylate, ethoxylated isocyanuric acid tri(meth)acrylate, ethoxylated glycerol tri(meth)acrylate, trimethylolpropane tri(meth)acrylate, ethoxylated trimethylolpropane tri(meth)acrylate, pentaerythritol tetra(meth)acrylate, ethoxylated pentaerythritol tetra(meth)acrylate, propoxylated pentaerythritol tetra(meth)acrylate, di-trimethylolpropane tetra(meth)acrylate, and di-pentaerythritol hexa(meth)acrylate.

As the photosensitive monomer, in particular, from the standpoint of obtaining good UV sensitivity and fine patterning, one having a weight average molecular weight in a range of preferably 150 to 3000, particularly preferably 150 to 2000, and having therein preferably at least two (meth)acryl groups, particularly preferably at least four (meth)acryl groups, is preferable.

The content of the photosensitive monomer is preferably in a range from 5 to less than 50 parts by weight per 100 parts by weight of the photosensitive prepolymer.

An example of the thermosetting resin used in the present invention is an epoxy resin.

From the standpoint of good adhesion, solder heat resistance, and developability being obtained, the thermosetting resin is preferably an epoxy resin that has an epoxy group equivalent amount in a range from 100 to less than 600 g/eq, particularly preferably in a range from 100 to 300 g/eq, and contains at least two epoxy groups per molecule.

Specific examples of the epoxy resin include biphenyl type epoxy resins, bisphenol type epoxy resins (e.g. bisphenol A type, bisphenol F type, bisphenol S type, etc.), novolak type epoxy resins (e.g. phenol novolak type, cresol novolak type, etc.), naphthalene ring-containing epoxy resins, and alicyclic epoxy resins. Of these, a biphenyl type epoxy resin is preferable from the standpoint of good adhesion and solder heat resistance being obtained.

The thermosetting resin is preferably contained in an amount such that the ratio of the epoxy group equivalent amount of the thermosetting resin to the carboxylic acid equivalent amount of the photosensitive prepolymer (former: latter) is in a range of 1:1 to 1:2. If this ratio is in this preferable range, then good adhesion and solder heat resistance are obtained.

As the curing agent used in the present invention, in particular, from the standpoint of further lengthening the shelf life and improving the normal temperature storage stability, and good adhesion and solder heat resistance being obtained, at least one selected from Lewis acid-amine complexes is preferable. Examples of such Lewis acid-amine complexes include complexes between a Lewis acid such as $BF_3$, $BCl_3$, $TiCl_4$, $SnCl_4$, $SnCl_3$, $ZnBr_2$, $ZnCl_2$, $Zn(CH_3COO)_2$, $AlCl_3$, $AlBr_3$, $SiCl_4$ or $FeCl_3$, and an amine compound such as monoethylamine, n-hexylamine, benzylamine, triethylamine, aniline or piperidine. Of these, a $BF_3$ complex such as a complex between $BF_3$ and monoethylamine is preferable.

The content of the curing agent is preferably in a range from 0.1 to less than 1.0 parts by weight per 100 parts by weight of the thermosetting resin. If this content is in this preferable range, then good adhesion, solder heat resistance, and migration characteristics are obtained.

From the standpoint of good UV sensitivity being obtained, the polymerization initiator used in the present invention preferably comprises a photopolymerization initiator and a photosensitizer.

The content of the photopolymerization initiator is preferably in a range from 5 to less than 15 parts by weight per 100 parts by weight of the photosensitive prepolymer.

Moreover, the content of the photosensitizer is preferably in a range from 0.5 to less than 5 parts by weight per 100 parts by weight of the photosensitive prepolymer.

As the photopolymerization initiator, in particular, from the standpoint of further lengthening the shelf life and improving the normal temperature storage stability, a photopolymerization initiator not containing an N atom (a nitrogen atom), for example a photopolymerization initiator not containing a primary, secondary or tertiary amine structure is preferable. Specific examples of photopolymerization initiators not containing an N atom include 2,2-dimethoxy-1,2-diphenylethan-1-one, 1-hydroxy-cyclohexyl-phenyl ketone, 2-hydroxy-2-methyl-1-phenyl-propan-1-one, 1-[4-(2-hydroxy)phenyl]-2-hydroxy-2-methyl-1-propan-1-one, and 2,4,6-trimethylbenzoyl-diphenyl-phosphine oxide.

As the photosensitizer, in particular, from the standpoint of further lengthening the shelf life and improving the normal temperature storage stability, a photosensitizer not containing an N atom, for example a photosensitizer not containing a primary, secondary or tertiary amine structure is preferable. Specific examples of photosensitizers not containing an N atom include 2,4-diethylthioxanthone, bis (2,6-dimethoxybenzoyl)-2,4,4-trimethyl-pentylphosphine oxide, and bis(2,4,6-trimethylbenzoyl)phenylphosphine oxide.

To obtain good fire retardancy, the photosensitive thermosetting resin composition of the present invention may contain a fire retardant. Examples of fire retardants are inorganic fillers such as aluminum hydroxide, silica and barium sulfate, and organo-phosphorus compounds such as phosphoric acid esters. The content of an inorganic filler is preferably in a range of 30 to 70 parts by weight per 100 parts by weight of the photosensitive prepolymer. By including an inorganic filler, in addition of the fire retardancy, the adhesion can also be improved. The content of an organo-phosphorus compound is generally in a range of 20 to 70 parts by weight per 100 parts by weight of the photosensitive prepolymer. For example, in the case that the phosphorus content of the organo-phosphorus compound is 8 to 9 wt % relative to the total weight of the organo-phosphorus compound, the content of the organo-phosphorus compound is preferably in a range of 20 to 50 parts by weight per 100 parts by weight of the photosensitive prepolymer. One of the above fire retardants may be used alone, or a plurality may be used together.

Moreover, to further increase the flexibility after curing, the photosensitive thermosetting resin composition of the present invention may contain a urethane (meth)acrylate. An example of the urethane (meth)acrylate is one having one or two functional groups such as (meth)acrylate groups. Moreover, as the urethane (meth)acrylate, a commercially available one may be used, with specific examples including UX-0937, UX-2201 and UX-3204 (all made by Nippon Kayaku Co., Ltd.).

The weight average molecular weight (Mw) of the urethane (meth)acrylate is preferably in a range of 2000 to 10000, more preferably 2000 to 8000.

The content of the urethane (meth)acrylate is preferably in a range of 5 to 50 parts by weight, more preferably 10 to 40 parts by weight, per 100 parts by weight of the photosensitive prepolymer.

Moreover, the urethane (meth)acrylate preferably has a percentage elongation of not less than 80%. Here, the percentage elongation is the ratio obtained in accordance with the evaluation method of JIS K-7127. Specifically, the percentage elongation is determined using a test sample obtained through the following film formation method.

Film Formation Method 80 parts by weight of the urethane (meth)acrylate, 20 parts by weight of 2-hydroxypropyl acrylate, and 3 parts by weight of 1-hydroxy-cyclohexyl-phenyl-ketone are mixed together, and the mixture is applied to a thickness of 20 to 100 μm onto a PET film, then 500 to 1000 mJ/cm$^2$ UV exposure is carried out, and then the resulting film is stripped off from the PET, whereby the test sample is manufactured.

In addition to the above, the photosensitive thermosetting resin composition of the present invention may as necessary contain other additives commonly used in photosensitive thermosetting resin compositions.

The photosensitive thermosetting resin composition of the present invention is suitable for use predominantly in photosensitive cover lays, flexible printed wiring boards and so on. However, the photosensitive thermosetting resin composition of the present invention can also be used in multi-layer printed wiring boards, flex-rigid printed wiring boards, and so on.

Photosensitive Cover Lay

A photosensitive cover lay of the present invention is obtained by molding a photosensitive thermosetting resin composition as described above into a sheet. For the photosensitive cover lay of the present invention, due to being constructed from the above resin composition, molding into a sheet is possible, the shelf life is long and the normal temperature storage stability is excellent, there is good solder heat resistance after curing, high adhesive strength can be maintained, and handling is easy.

Moreover, the photosensitive cover lay of the present invention may have a release film provided on at least one surface of the above sheet made of the photosensitive thermosetting resin composition, being used after stripping off the release film during processing as appropriate.

The photosensitive cover lay of the present invention is a cover lay provided to protect the metal foil circuitry of a flexible printed wiring board having this circuitry (conductor pattern) provided thereon, and is provided, for example, by means such as photolithography in a state in which the resin composition is formed in a single layer or a plurality of layers on an electrically insulating synthetic resin film or the like. The release film of the photosensitive cover lay of the present invention is stripped off upon use.

One embodiment of the photosensitive cover lay of the present invention is a photosensitive cover lay 10 in which a release film 2 comprising an electrically insulating synthetic resin film (e.g. a PET (polyethylene terephthalate) film, a PP (polypropylene) film, a PE (polyethylene) film, etc.) or the like is provided on one surface of a sheet 1 molded from the photosensitive thermosetting resin composition as shown in FIG. 1. Note that FIG. 1 is a schematic sectional view showing this embodiment of the cover lay according to the present invention.

The photosensitive cover lay 10 of the embodiment shown in FIG. 1 is preferably such that the thickness of the sheet 1 is 20 to 60 μm, and the thickness of the release film 2 is 10 to 50 μm.

Flexible Printed Wiring Board

In a flexible printed wiring board of the present invention, a photosensitive cover lay as described above is provided on a metal foil forming circuitry.

An example of the flexible printed wiring board of the present invention is one in which the photosensitive cover lay is provided on a metal foil part of a metal-clad laminate for a flexible printed wiring board having circuitry provided thereon. Here, the metal-clad laminate for the flexible printed wiring board is a laminate comprising a film and the metal foil laminated together via an adhesive as required, and is a substrate used for the flexible printed wiring board.

As the film used here, for example a polyimide film, a polyester film, a polyamide film, or the like is used; of these, a polyimide film is preferable from the standpoint of fire retardancy, electrical insulation, heat resistance, modulus of elasticity, and so on. Note, however, that a film of another material may be used instead.

Moreover, as the metal foil, for example a conductive material such as copper foil or silver foil is used.

The flexible printed wiring board of the present invention can be manufactured, for example, by laminating, using the photosensitive cover lay 10 in which a release film 2 comprising a PET film is provided on one surface of the sheet 1 made of the photosensitive thermosetting resin composition, and a substrate 4 having thereon patterned copper foil 3, as shown in FIG. 2.

The laminating step is carried out, for example, by roll-laminating the photosensitive cover lay 10 onto the substrate 4 having the copper foil 3 provided thereon such that the surface of the sheet 1 is joined to the surface of the copper foil 3 on the substrate 4. At this time, the laminating roll temperature, the laminating roll linear load, the laminating roll speed, and so on are adjusted as appropriate. A flexible printed wiring board 20 can thus be formed.

As shown in FIG. 2, the flexible printed wiring board of the present invention is used through steps such as UV (ultraviolet) exposure and developing/thermal curing after the above laminating step.

In the UV exposure step, the photosensitive cover lay 10 on the substrate 4 having the copper foil 3 thereon is irradiated with UV from the release film 2 side via a photomask 5 having light-transmitting parts 5a and non-light-transmitting parts 5b formed in a prescribed pattern thereon using an extra-high pressure mercury lamp UV irradiating apparatus. Then, in the developing/thermal curing step, the release film is stripped off, and the unexposed parts are developed by spraying at a suitable pressure or the like using an alkaline aqueous solution that has been adjusted to a suitable temperature, and then heating treatment is carried out at a suitable temperature, thus forming a pattern. As a result, the photosensitive parts of the sheet 1 are cured by the UV, and the non-photosensitive parts are developed by the alkaline aqueous solution.

Note that the laminating, UV exposure, and developing/thermal curing steps can be automated.

By using the photosensitive cover lay described above, compared with the case of using a cover lay in which an adhesive layer is provided on a polyimide film (a conventional cover lay), there are the following merits.

(1) Fine patterning is possible.

(2) Hole formation using a mold and positioning are unnecessary in the manufacturing process, and hence automation through photolithography is possible.

(3) There is no exudation onto land parts.

(4) There is little dimensional change.

The (overall) thickness of the flexible printed wiring board of the present invention can be set as desired in accordance with the use.

The flexible printed wiring board of the present invention is suitable for use, for example, as a flexible printed wiring board for so-called chip on flex for IC chip mounting.

Moreover, the flexible printed wiring board of the present invention is not limited to the above embodiment, but rather may instead be a multi-layer printed wiring board in which several layers having a construction as described above are laminated on one another.

Following is a more detailed description of the present invention citing working examples and test examples; however, the present invention is not limited whatsoever by the following working examples.

WORKING EXAMPLES 1 to 18 and COMPARATIVE EXAMPLES 1 to 10

Photosensitive thermosetting resin compositions containing components in the proportions (units: parts by weight) shown in Tables 1 and 2 were prepared. Each photosensitive thermosetting resin composition was then molded into a sheet, and a release film was provided on at least one surface of the sheet, thus manufacturing a photosensitive cover lay.

1) Solder Heat Resistance Test Method

Each photosensitive cover lay (thickness: 25 to 50 μm) was laminated onto a copper-clad board, and UV irradiation, developing, and curing by heating were carried out. After that, the board was dipped for 30 seconds into a solder bath set to either 260° C. or 288° C. It was visually inspected whether there was any peeling, blistering, or the like. The solder heat resistance was then evaluated in accordance with the following criteria.

◎: No peeling/blistering upon dipping for 30 seconds at 288° C.

○: No peeling/blistering upon dipping for 30 seconds at 260° C., but some peeling/blistering upon dipping for 30 seconds at 288° C.

x: Some peeling/blistering upon dipping for 30 seconds at 260° C.

2) Adhesion Test Method

Each photosensitive cover lay was laminated onto a copper-clad board, and UV irradiation, and curing by heating were carried out. After that, cuts were put into the photosensitive cover lay using a cutter, thus producing a cross-cut pattern of 100 (10×10) squares each of side 1 mm or 2 mm. Cellophane adhesive tape was stuck onto the cross-cut pattern produced, and the tape was pulled off instantaneously while keeping one end thereof perpendicular to the surface of the cover lay. The number of squares in the cross-cut pattern remaining was counted, with 100 squares remaining being taken as a pass in accordance with the following criteria. Note that the above test method follows JIS D 0202 (1988) General Rules for Coating Films for Automobile Parts 4.15.

○: 100/100 remaining x: 0/100 to 99/100 remaining

The results of the above are shown in Tables 1 and 2.

TABLE 1

| Component (Units for contents: parts by weight) | Working Example | | | | | | | | | | | | | | | | | |
|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 |
| Photosensitive prepolymer (A) | 100 | 100 | 100 | 100 | 100 | 100 | 50 | 50 | 50 | 50 | 50 | 50 | 50 | 50 | 50 | 50 | 50 | 50 |
| Photosensitive prepolymer (B-1) | | | | | | | 50 | 50 | 50 | 50 | 50 | 50 | | | | | | |
| Photosensitive prepolymer (B-2) | | | | | | | | | | | | | 50 | 50 | 50 | 50 | 50 | 50 |
| Photosensitive monomer | 30 | 30 | 30 | 30 | 30 | 30 | 30 | 30 | 30 | 30 | 30 | 30 | 30 | 30 | 30 | 30 | 30 | 30 |
| Thermosetting resin | 40 | 40 | 40 | 40 | 40 | 40 | 40 | 40 | 40 | 40 | 40 | 40 | 25 | 25 | 25 | 25 | 25 | 25 |
| Curing agent 1 | 0.2 | 0.2 | 0.2 | 0.2 | | | 0.2 | 0.2 | 0.2 | 0.2 | | | 0.2 | 0.2 | 0.2 | 0.2 | | |
| Curing agent 2 | | | | | 0.2 | 0.2 | | | | | 0.2 | 0.2 | | | | | 0.2 | 0.2 |
| Photopolymerization initiator 1 | 9 | 9 | | 9 | 9 | | 9 | 9 | | 9 | 9 | | 9 | 9 | | 9 | 9 | |
| Photopolymerization initiator 2 | | | 9 | | | 9 | | | 9 | | | 9 | | | 9 | | | 9 |

TABLE 1-continued

| Component (Units for contents: parts by weight) | Working Example | | | | | | | | | | | | | | | | | |
|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 |
| Photosensitizer 1 | 2 | 2 | 2 | | 2 | 2 | 2 | 2 | 2 | | 2 | 2 | 2 | 2 | 2 | | 2 | 2 |
| Photosensitizer 2 | | | | 2 | | | | | | 2 | | | | | | 2 | | |
| Urethane acrylate | 30 | | | | | | 30 | | | | | | 30 | | | | | |
| Solder heat resistance | ⊚ | ⊚ | ⊚ | ⊚ | ⊚ | ⊚ | ⊚ | ○ | ○ | ○ | ○ | ○ | ⊚ | ○ | ○ | ○ | ○ | ○ |
| Adhesion (cross cut test) | ○ | ○ | ○ | ○ | ○ | ○ | ○ | ○ | ○ | ○ | ○ | ○ | ○ | ○ | ○ | ○ | ○ | ○ |
| Flexibility | ○ | x | x | x | x | x | ○ | x | x | x | x | x | ○ | ○ | ○ | ○ | ○ | ○ |

Notes)
(A) Carboxylic acid-modified bisphenol type epoxy acrylate: Mw = 10000, carboxylic acid equivalent amount 560 g/eq
(B-1) Carboxylic acid-modified cresol novolak type epoxy acrylate: Mw = 10000, carboxylic acid equivalent amount 560 g/eq
(B-2) Carboxylic acid-modified urethane acrylate: Mw = 3000, carboxylic acid equivalent amount 1400 g/eq
Photosensitive monomer: Monomer of molecular weight 150 to 2000 containing at least 4 (meth)acryl groups
Thermosetting resin: Epoxy equivalent amount 270 g/eq, biphenyl backbone type epoxy resin
Curing agent 1: $BF_3$ MEA (boron trifluoride-monoethylamine) (Lewis acid-amine complex)
Curing agent 2: 2-methylimidazole
Photopolymerization initiator 1: 2,2-dimethoxy-1,2-diphenylethan-1-one
Photopolymerization initiator 2: 2-methyl-1-[4-(methylthio)phenyl]-2-morpholinopropan-1-one
Photosensitizer 1: Bis(2,4,6-trimethylbenzoyl)phenylphosphine oxide
Photosensitizer 2: p-dimethylaminobenzoic acid ethyl ester
Urethane acrylate: "UX-0937" (trade name) made by Nippon Kayaku Co., Ltd. (molecular weight 2000 to 8000, percentage elongation ≥ 80%, number of functional groups (acrylate groups) = 2)

TABLE 2

| Component (Units for contents: parts by weight) | Comparative Example | | | | | | | | | |
|---|---|---|---|---|---|---|---|---|---|---|
| | 1 | 2 | 3 | 4 | 5 | 6 | 7 | 8 | 9 | 10 |
| Photosensitive prepolymer (A) | | | | | | | | | | |
| Photosensitive prepolymer (B-1) | 100 | 100 | 100 | 100 | 100 | | | | | |
| Photosensitive prepolymer (B-2) | | | | | | 100 | 100 | 100 | 100 | 100 |
| Photosensitive monomer | 30 | 30 | 30 | 30 | 30 | 30 | 30 | 30 | 30 | 30 |
| Thermosetting resin | 40 | 40 | 40 | 40 | 40 | 18 | 18 | 18 | 18 | 18 |
| Curing agent 1 | 0.2 | 0.2 | 0.2 | | | 0.1 | 0.1 | 0.1 | | |
| Curing agent 2 | | | | 0.2 | 0.2 | | | | 0.1 | 0.1 |
| Photopolymerization initiator 1 | 9 | | 9 | 9 | | 9 | | 9 | 9 | |
| Photopolymerization initiator 2 | | 9 | | | 9 | | 9 | | | 9 |
| Photosensitizer 1 | 2 | 2 | | 2 | 2 | 2 | 2 | | 2 | 2 |
| Photosensitizer 2 | | | 2 | | | | | 2 | | |
| Solder heat resistance | X | X | X | X | X | X | X | X | X | X |
| Adhesion (cross cut test) | X | X | X | X | X | X | X | X | X | X |

Details of components are as for Table 1

3) Flexibility Test Method

Each photosensitive cover lay was laminated onto one surface of a 25 μm-thick PI film, UV exposure (250 to 500 mJ/cm²) was carried out, and then thermal curing was carried out for 30 to 60 minutes at 150° C., thus producing a test sample.

The test sample was given a 180° mountain fold with the photosensitive cover lay surface on the outside. At this time, a 300 gf/cm load was applied using a rubber roller.

It was visually inspected whether or not cracks appeared in the photosensitive cover lay surface.

Cracking: x

No cracking: o

Moreover, the following lifetime evaluation was also carried out for the photosensitive thermosetting resin composition of each of Working Examples 1, 7 and 13.

4) Lifetime (Developability) Evaluation Method

Each photosensitive cover lay (thickness: 25 to 50 μm) was roll-laminated onto a copper-clad board (laminating roll temperature 50 to 120° C., laminating roll linear load 1.0 to 2.0 kgf/cm, laminating roll speed 0.3 to 2.0 m/min), and then irradiation was carried out with an exposure of 250 to 500 mJ/cm² using an extra-high pressure mercury lamp UV irradiating apparatus (made by Ushio Inc., model ML-251 D/B (irradiating optical unit PM25C-200)) via a photomask having a prescribed pattern (L/S=100/100 μm) formed therein.

After that, unexposed parts were developed by spraying (pressure 0.18 MPa) with a 1 wt % sodium carbonate aqueous solution (temperature of chemical solution 30° C.), and then heating treatment was carried out for 30 to 60 minutes at 150° C., thus forming a pattern. As the method of inspecting the pattern, the pattern shape was examined and developing residue was looked for using an optical microscope. As the lifetime evaluation criteria, if, after storing in a dark place at 23° C. for a prescribed period of time, there was no developing residue on the unexposed parts upon carrying out the above processing, and moreover a rectangular pattern was formed, then this was taken as a pass. A model BX51TRF made by Olympus Corporation was used as the optical microscope, with the measurement being carried out under a magnification of ×50 to ×200.

⊚: After storing for 14 days, in above lifetime evaluation, no developing residue on unexposed parts, and rectangular pattern formed.

○: After storing for 10 days, in above lifetime evaluation, no developing residue on unexposed parts, and rectangular pattern formed.

x: After storing for 3 days, in above lifetime evaluation developing residue arose on unexposed parts, or rectangular pattern not formed.

The evaluation results were Working Example 1: ○, Working Example 7: ⊚, and Working Example 13: ⊚.

INDUSTRIAL APPLICABILITY

The present invention has industrial applicability as a photosensitive thermosetting resin composition that has a long shelf life and has excellent normal temperature storage stability, has good solder heat resistance after curing, and according to which high adhesive strength can be maintained, and a photosensitive cover lay and a flexible printed wiring board using the composition.

We claim:

1. A photosensitive thermosetting resin composition containing a photosensitive prepolymer, a photosensitive monomer, a thermosetting resin, a curing agent, and a polymerization initiator, the photosensitive prepolymer containing (A) a carboxylic acid-modified bisphenol epoxy (meth)acrylate and (B) at least one of a carboxylic acid-modified cresol novolak epoxy (meth)acrylate and a carboxylic acid-modified urethane (meth)acrylate, wherein the polymerization initiator comprises a photopolymerization initiator not containing a nitrogen atom and a photosensitizer not containing a nitrogen atom.

2. The photosensitive thermosetting resin composition according to claim 1, wherein the carboxylic acid-modified bisphenol epoxy (meth)acrylate, which is the component (A), has an average molecular weight in a range of 5000 to 20,000.

3. The photosensitive thermosetting resin composition according to claim 1, wherein the carboxylic acid-modified bisphenol epoxy (meth)acrylate, which is the component (A), has a carboxylic acid equivalent amount in a range from 300 to less than 1500 g/eq.

4. The photosensitive thermosetting resin composition according to claim 1, wherein the carboxylic acid-modified cresol novolak epoxy (meth)acrylate of the component (B) has an average molecular weight in a range of 5000 to 15,000, and the carboxylic acid-modified urethane (meth) acrylate of the component (B) has an average molecular weight in a range of 2000 to 15,000.

5. The photosensitive thermosetting resin composition according to claim 1, wherein the carboxylic acid-modified cresol novolak epoxy (meth)acrylate of the component (B) has a carboxylic acid equivalent amount in a range from 300 to less than 1500 g/eq, and the carboxylic acid-modified urethane (meth)acrylate of the component (B) has a carboxylic acid equivalent amount in a range from 500 to less than 2000 g/eq.

6. The photosensitive thermosetting resin composition according to claim 1, wherein the weight ratio of the component (A) to the component (B) constituting the photosensitive prepolymers is in a range of 80:20 to 20:80.

7. The photosensitive thermosetting resin composition according to claim 1, wherein the thermosetting resin is an epoxy resin that has an epoxy group equivalent amount in a range from 100 to less than 600 g/eq, and contains at least two epoxy groups per molecule.

8. The photosensitive thermosetting resin composition according to claim 7, wherein the photosensitive prepolymer has a carboxylic acid equivalent amount, and wherein the thermosetting resin is contained in an amount such that the ratio of the epoxy group equivalent amount of the thermosetting resin to the carboxylic acid equivalent amount of the photosensitive prepolymer is in a range of 1:1 to 1:2.

9. The photosensitive thermosetting resin composition according to claim 1, wherein the curing agent comprises at least one selected from Lewis acid-amine complexes.

10. The photosensitive thermosetting resin composition according to claim 1, wherein the content of the curing agent is in a range from 0.1 to less than 1.0 parts by weight per 100 parts by weight of the thermosetting resin.

11. The photosensitive thermosetting resin composition according to claim 1, wherein the content of the photopolymerization initiator is in a range from 5 to less than 15 parts by weight per 100 parts by weight of the photosensitive prepolymer.

12. The photosensitive thermosetting resin composition according to claim 1, wherein the content of the photosensitizer is in a range from 0.5 to less than 5 parts by weight per 100 parts by weight of the photosensitive prepolymer.

13. The photosensitive thermosetting resin composition according to claim 1, wherein the photosensitive monomer has an average molecular weight in a range of 150 to 3000, and has at least two (meth)acryl groups therein.

14. The photosensitive thermosetting resin composition according to claim 1, wherein the content of the photosensitive monomer is in a range from 5 to less than 50 parts by weight per 100 parts by weight of the photosensitive prepolymer.

15. A photosensitive cover lay comprising the photosensitive thermosetting resin composition according to claim 1 molded into a sheet.

16. A flexible printed wiring board in which the photosensitive cover lay according to claim 15 is disposed on metal foil circuitry of the flexible printed wiring board.

17. A photosensitive thermosetting resin composition containing a photosensitive prepolymer, a photosensitive monomer, a thermosetting resin, a curing agent, and a polymerization initiator, the photosensitive prepolymer containing (A) a carboxylic acid-modified bisphenol epoxy (meth)acrylate, (B) at least one of a carboxylic acid-modified cresol novolak epoxy (meth)acrylate and a carboxylic acid-modified urethane (meth)acrylate, and (C) a urethane (meth)acrylate.

18. The photosensitive thermosetting resin composition according to claim 17, wherein the content of the urethane (meth)acrylate is in a range of 5 to 50 parts by weight per 100 parts by weight of the photosensitive prepolymer.

19. A photosensitive cover lay comprising the photosensitive thermosetting resin composition according to claim 17 molded into a sheet.

20. A flexible printed wiring board in which the photosensitive cover lay according to claim 19 is disposed on metal foil circuitry of the flexible printed wiring board.

* * * * *